United States Patent
Saho et al.

(10) Patent No.: US 6,563,312 B2
(45) Date of Patent: May 13, 2003

(54) MINIMAL MAGNETIC FIELD-MEASUREMENT DEWAR VESSEL

(75) Inventors: Norihide Saho, Tsuchiura (JP); Hiroyuki Tanaka, Hitachinaka (JP); Hitoshi Sasabuchi, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/928,357

(22) Filed: Aug. 14, 2001

(65) Prior Publication Data

US 2002/0024338 A1 Feb. 28, 2002

(30) Foreign Application Priority Data

Aug. 31, 2000 (JP) ........................ 2000-264379

(51) Int. Cl.⁷ .................. G01R 33/035; F25B 19/00
(52) U.S. Cl. ........................ 324/248; 62/51.1
(58) Field of Search .................... 324/248; 505/846; 327/528; 600/409; 62/51.1, 45.1

(56) References Cited

U.S. PATENT DOCUMENTS

| 3,980,076 A | * | 9/1976 | Wikswo et al. | ............. 600/409 |
| 4,761,611 A | * | 8/1988 | Hoenig | ............. 324/248 |
| 5,061,685 A | * | 10/1991 | Kosuge et al. | ............. 174/35 R |
| 5,065,582 A | * | 11/1991 | Seifert | ............. 335/216 |
| 5,235,818 A | * | 8/1993 | Horikawa et al. | ............. 505/892 |
| 5,894,220 A | * | 4/1999 | Wellstood et al. | ............. 250/330 |

FOREIGN PATENT DOCUMENTS

| JP | 02303077 A | * | 12/1990 | ............. H01L/39/04 |
| JP | 06021520 A | * | 1/1994 | ............. H01L/39/04 |

* cited by examiner

*Primary Examiner*—Edward Lefkowitz
*Assistant Examiner*—Darrell Kinder
(74) *Attorney, Agent, or Firm*—Antonelli, Terry, Stout & Kraus, LLP (57) ABSTRACT

A minimal magnetic-field measurement Dewar vessel includes an inner container which contains a superconducting device and cooling medium, a radiation shield which is composed of an electrical insulation substrate and a first and second plurality of thin line stripes provided on opposite surfaces of the electrical insulation substrate so that the first plurality of thin line stripes is electrically insulated from the second plurality of thin line stripes and provided in a high stripe dense state, an outer container, and a cooling apparatus. A width of one portion of at least one of the first and second plurality of thin line stripes arranged in one area of the radiation shield surrounding the superconducting device is smaller than a width of another portion of the at least one of the first and second plurality of thin line stripes arranged in another area of the radiation shield, respectively.

10 Claims, 7 Drawing Sheets

MINIMAL MAGNETIC FIELD-MEASUREMENT DEWAR VESSEL

BACKGROUND OF THE INVENTION

The present invention relates to a Dewar vessel (double structural container, which include a vacuum space, for using very low substances) for containing SQUId (Superconducting Quantum Interference Devices) which is used for a transducer of magnetic signal-transducer, a material property-measurement instrument for measuring the magnetic permeability of a substance, magnetic field generated from a human body or a living being.

Here, the SQUId is held in a very low temperature by using liquid helium or liquid nitrogen in an adiabatic cooling container (cryostat), and a loop of the SQUId including Josephson junctions is driven by applying DC current to the SQUId as a bias current. If magnetic fluid from the outside is input via a pick-up coil or an input coil, an orbital current is induced, and the very weak magnetic fluid applied from the outside is largely amplified by the quantal interference effect of the Josephson junctions. The element is used a magnetic field transducer for measuring minimal magnetic fluid.

Japanese Patent Application Laid-Open Hei 6-21520 discloses the composition of a radiation shield.

Although a conventional SQUId magnetic field measurement Dewar vessel is made of non-metallic material in order to reduce magnetic noises, it is necessary to use metal such as copper because a radiation shield member must has high heat conduction. However, if the shield member is metallic, changes in very weak magnetic field causes a weak induced current in the radiation shield, which in turn causes a measurement error. This has been a large problem in the magnetic field measurement. To solve this problem, in Japanese Patent Application Laid-Open Hei 6-21520, thin stripes insulated each other are used in the radiation shield.

Further, since the radiation shield is made of very thin foil in order to cause induced current, a substrate to which the metal foils are fixed is thin so as to be easily processed in fabrication of the radiation shield. Accordingly, the stiffness of the substrate of the shield is also weak. Thus, the radiation shield easily contacts an inner container, which in turn increases the evaporation amount of liquid helium which has been poured into the inner contain, and the consumption amount of liquid helium Furthermore, if thin stripes insulated each other, which are fixed to a substrate, used as the radiation shield, the width of each stripe the SQUId is reduced near the SQUID in order to decrease an induced current due to changes in magnetic field, and this increase the resistance of conducting heat in each metallic stripe, and the temperature of the radiation shield. In addition, the groove portions in which the meatic stripes do not esist are not sufficiently cooled, and the above described problems will reduce the stiffens of the radiation shield this may increaseas the probability of that the radiation shield contacts the very low temperatureh internal container.

SUMMARY OF THE INVENTION

The present invention has been achieved in consideration with the above problems, is aimed at providing a Dewar vessel which is easily fabricated, and consists of a high performance radiation shield of small induced current, and at preventing increase of necessary liquid helium.

Thus, the present invention provides an minimal magnetic-field measurement Dewar vessel including an inner container which contains a superconducting device and cooling medium; a radiation shield which is composed of a plurality of thin line stripes electrically insulated each other and in a high stripe dense state; the inner container, an outer container which surrounds the radiation, and in which a vacuum state is kept, and a cooling apparatus which cools the radiation shield;

wherein the number density and the width of, each thin line stripe arranged surrounding the superconducting device is larger and smaller than those values of a thin line stripe arranged in other areas, respectively. Further, an electrical insulation supporting means is provided so as to keep a distance between and the radiation shield and the inner container at a predetermined value.

In accordance with the present invention, a radiation shield is composed so that a plurality of a thin stripe members of high thermal conductivity is fixed to an electrical insulation substrate, and gaps between the stripe members gradually narrower as the radiation shield are nearer to a superconducting apparatus. Accordingly, in the longitudinal direction, since the width of the stripe members at the portion of a cooling means and a thermal contact is large, if the end part of the substrate in the longitudidal direction is cooled, the whole system can be well colled even in the other end part. Moreover, since the width of each stripe member becomes very thin, and the tripe members electrically insulate each otter, even if an induced current is caused due to changes in magnetic field as the SQUID, the induced current is very small due to the thin width of the stripe members. Thus, it has becomes possible to provide a thermal shield plate causes a very small magnetic measurement shield.

Further, the stripe members of high thermal conductivity are fixed while electrically insulating each other, and are arranged so that each groove line is not located at the same position on both surfaces of the substrate. Therefore, there is always a stripe member directly is formed directly above each groove via the substrate. Accordingly, each groove on the surface of the substrate is always cooled by a corresponding stripe member on the surface of the substrate, the temperature increase due to insufficient cooling of each groove lien can be prevented.

Furthermore, by support the radiation shield by an electrical insulation support means of high stiffness in order to keep the distance between the internal container and the radiation shield at a predetermined, it can be solved that increase of helium evaporation when the radiation shield of low stiffness thermally contacts the internal container during operations or a transportation of the Dewar vessel, and the heat transfers into the internal container from the radiation shield.

Other features and advantages of the present invention will becomes clear by the drawings and their explains.

DETAILED DESCRIPTION OF THE EMBODIMENTS

Figure 1:
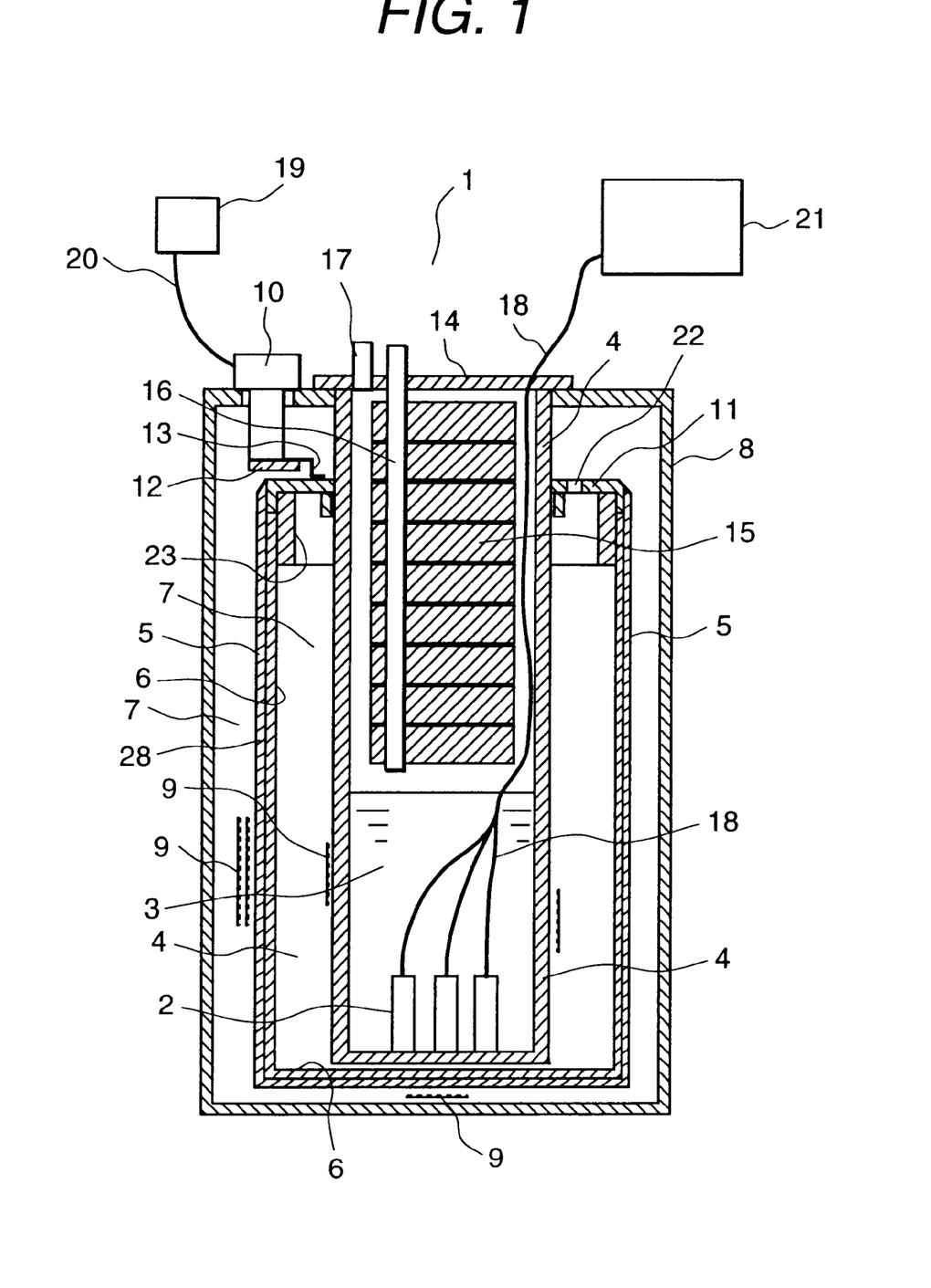
FIG. 1 is a vertical cross section showing the composition of an minimal magnetic field-measurement Dewar vessel of an embodiment according to the present invention.

Hereafter, the embodiments will be explained in detail with reference to the drawings. As shown in FIG. 1 the Dewar vessel 1 of an embodiment according to the present invention includes: an inner container 4 which contains a superconducting device SQUID and liquid helium 3 cooling the SQUID; a radiation shield 5 and a radiation shield support member 6 consisting of a radiation shield means 6 is arranged so as to surrounding the inner container 4; an outer container. 8 for providing a space of a vacuum layer 7 outside the inner container 4 by surrounding the radiation shield (thermal shield) 5 and the radiation shield support member 6; adiabatic members 9 which are inserted in the vacuum layer 7; a refrigerator 10 such as a pulse pipe type refrigerator, for cooling one edge side of the radiation shield 5; a flange 11, which has an exhaust outlet, integrates with a neck portion of the inner container 4; a copper low temperature stage 12 situated in the refrigerator 10; a flexible thermal conduction member 13 for thermally connecting the low temperature stage 12 and the flange 11, a cap 14 for separating the outside air, and the liquid helium 3 and its vapor; a liquid helium-feeding inlet 16 for feeding liquid helium from the outside via the cap and an thermal insulation member 15, a helium gas exhaust outlet 17, and measurement wires 18 for leading a measurement signal detected by the SQUid 2 to the outside of the Dewar vessell.

Multi-layer members made of polyester resin foils deposited aluminum films, etc., are used for the thermal insulation member 9. The refrigerator 10 is connected to the helium compressor 19 and the exhaust pipe 20. The measurement signal detected by the SQUid 2 is transmitted via the measurement wire 18 to the signal processing device 21, and image processing is performed using the measurement signal. The radiation shield support 6 of high stiffness, which has an exhaust outlet 28 in order to make inner space in an air tight state, contains the inner container 4, and keeps a distance between the radiation shield support 6 and, the inner container at a predetermined value. Further, the radiation shield support 6 is supported by a cylindrical guide rib 23 fixed to the copper flange 11. The upper part of radiation shield 5 is thermally fixed to the copper flange 11 by soldering.

By the above composition, the radiation shield 5 is cooled by the refrigerator 10, and the radiation heat from the outer container 8 is removed. As the radiation shield 5, it is necessary to use metal material of high thermal conductivity, such as copper, such metal is shaped to thin stripe members in order to reduce eddy current which hinder the weak signal to be measured by the SQUId 2.

Figure 2:
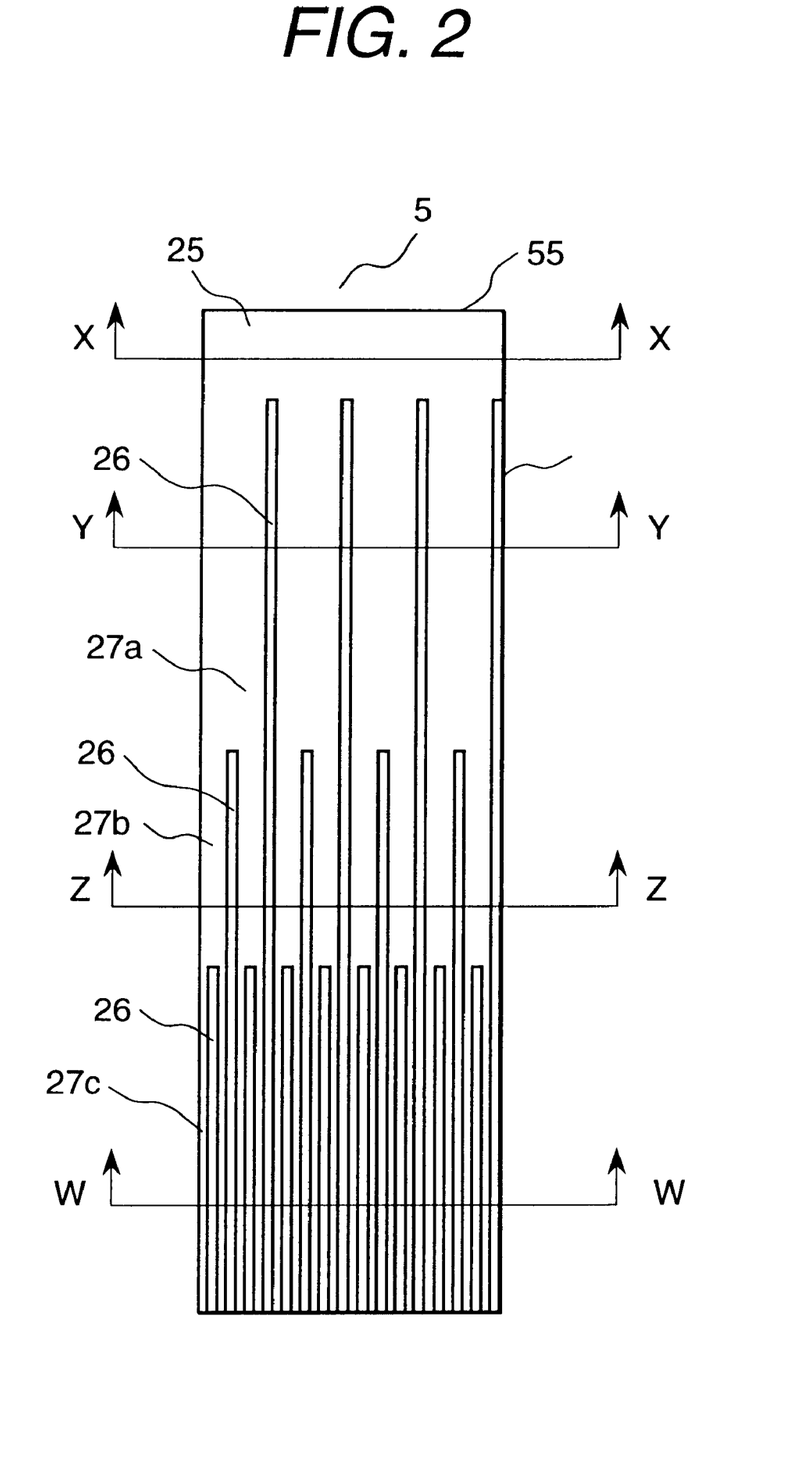
FIG. 2 is an elevation view showing the detailed composition of a radiation shield of an embodiment according to the present invention.
Figure 3:
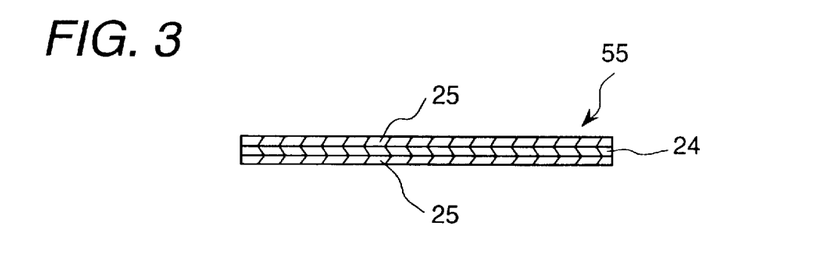
FIG. 3 is a cross section view at X—X line of the radiation shield shown in FIG. 2.
Figure 4:
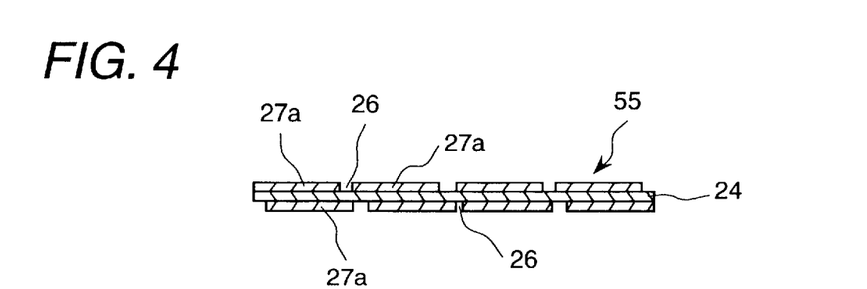
FIG. 4 is a cross section view at Y—Y line of the radiation shield shown in FIG. 2.
Figure 5:
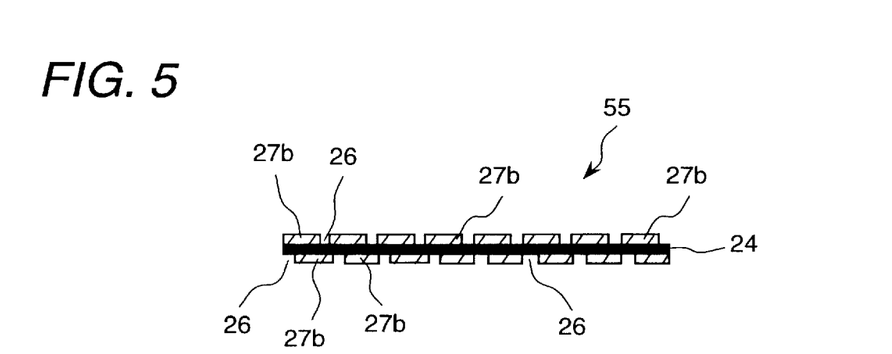
FIG. 5 is a cross section view at Z—Z line of the radiation shield shown in FIG. 2.
Figure 6:
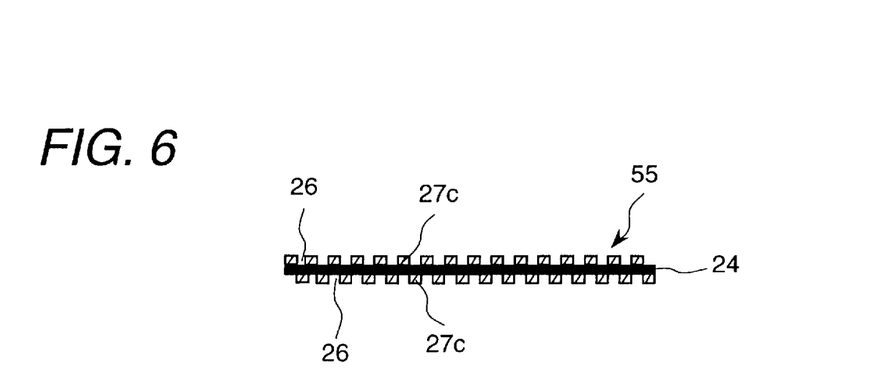
FIG. 6 is a cross section view at W—W line of the radiation shield shown in FIG. 2.

In the following, the composition of the radiation shield 5 will be explained with reference to the FIG. 2–FIG. 6. FIG.3 shows the cross section of the radiation shield 5 at the line X—X, and FIG. 4 shows the cross section at the line Y—Y. Also, FIG. 5 shows the cross section at the line Z—Z, and FIG. 6 shows the cross section at the line W—W. As shown in FIG. 2, the radiation shield 5 includes thin metal stripe-plates 55 which are made by etching two copper foil fixed to the both surfaces of the electrical insulation substrates 24. The flange 11 cooled by the refrigerator has no groove. At the lower portion, thin thermal conducting stripes, that is, thin copper stripe members 27a, 27b, and 27c, are shaped and fixed to the surfaces insulation substrates 24. The thin copper stripe members 27a, 27b, and 27c, are thin stripe members.

Here, the insulation substrate 24 on which a thin copper stripe members 27a, 27b, and 27c, are formed, is a flexible plate of a 0.1–0.3 mm , and the substrate is made of a plastic film such as polyimide film , and the copper films of 0.3–1.0 mm thickness are fixed to the both surfaces of the substrate 24 by a chemical etching method. Thus, a many of groove lined (having no copper foil) 26, are formed by a chemical etching method, etc., and thin stripe members of 27a, 27b, 27c can he simultaneously and at once heating process. Further, in this continuous process, the widths of the tripe 27a, 27b, 27c, are shaped 5.3 mm, 1.5–2.5 mm, 0.5–1.0 mm, respectively. The width of each copper stripe increases from the SQUID toward the refrigerator. Further, a copper stripe is located directly above of each groove 26 the electrical insulation substrate 24.

By the above composition Dewar vessel, the Dewar vessel of the present invention is composed of the inner container including the superconducting device and cooling medium, and is maintained in an electrical insulation state by using the radiation shield consisting of a plurality of thin stripes in a high stripe density. In the minimal magnetic measurement Dewar vessel including the radiation shield situated outside the internal container, and the outer container for keeping vacuum in the Dewar vessel, the refrigerator can efficiently cool the radiation shield, because the stripe arranging density is higher at the portion surrounding the superconducting device than the other portion of the radiation shield, which in turn can implement an high performance minimal magnetic field measurement Dewar vessel.

Moreover, the stripe width is narrow, and the stripe density (the number of stripes in an unit area of the radiation shield) are large.

Also, a groove is shaped between neighboring stripes.

Although the width of each copper stripe is 0.1–1.0 mm in this conventional type radiation shield, in this embodiment, the width of stripe members arranged near the SQUID 2 are shaped to be thin, and the width of stripe members are shaped to be wide in other end portion. Therefore, the permeability of external magnetic-field changes into the SQUID 2 is improved, and can be well cooled. That is, it is possible to minimally reduce eddy current in the thin stripe members 27, which in turn makes it possible for minimal magnetic field to reach the SQUID 2.

On the other hand, the radiation heat flowing to the thin stripe members 27 via the insulation parts 9 in the very low temperature parts from the outer container 8, can efficiently flows the wider stripe members of low thermal conductivity, namely the stripe members 27a and 27b of small thermal resistance. Further, in a conventional radiation shield, stripe members are fixed to one surface of the radiation shield, and each groove is cooled by neighboring stripes. If the insulation substrate 24 is made to be thinner in order to improve its flexibility and fabrication easiness, the thermal resistance of the substrate greatly increases, which in turn can cool the radiation shield to be lower. Thus, the radiation shield performance is improved, and this reduces the evaporation amount of liquid helium 3 can be decreased.

Figure 7:
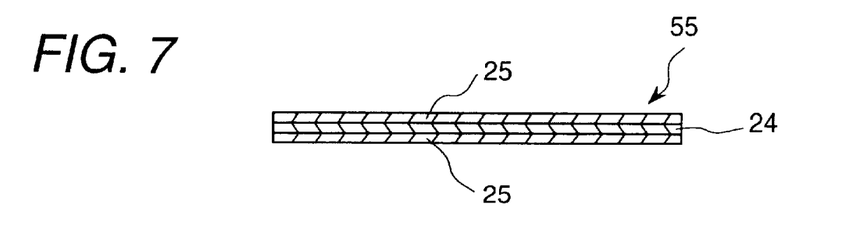
FIG. 7 is a cross section.view at X—X line of the radiation shield shown in FIG. 2 of another embodiment.
Figure 8:
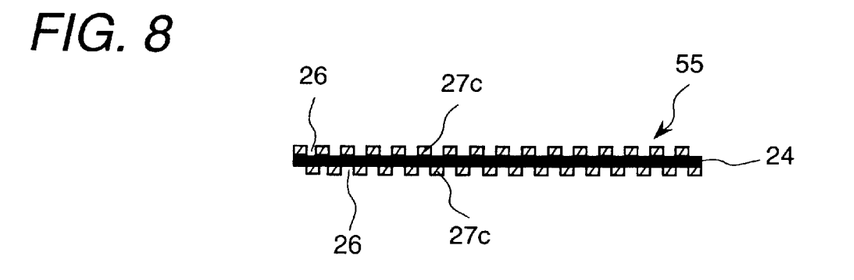
FIG. 8 is a cross section view at X-Y line of the radiation shield shown in FIG. 2 of another embodiment.
Figure 9:
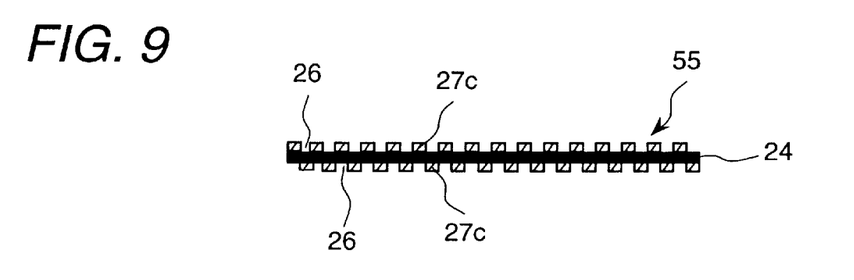
FIG. 9 is a cross section view at Z—Z line of the radiation shield shown in FIG. 2 of another embodiment.
Figure 10:
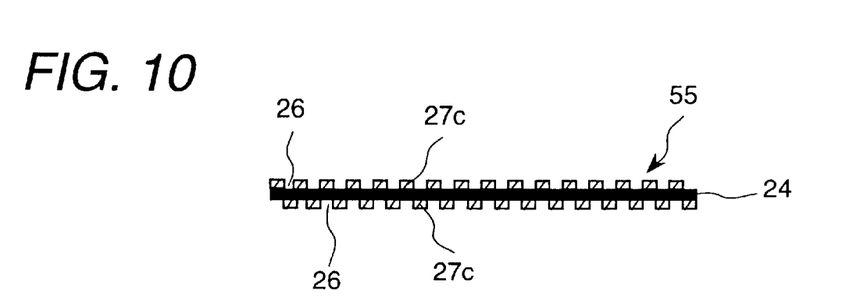
FIG. 10 is a cross section view at W—W line of the radiation shield shown in FIG. 2 of another embodiment.

If the thin stripe members are fixed to both surfaces, the structure shown in FIG. 4 or FIG. 5 can be replaced with the structure shown in FIG. 6. In this embodiment, the radiation shield is composed of the structure shown in FIG. 7 for the structure shown in the structure shown in FIG. 10 the structures shown in FIGS. 7, 8, 9, and 10 correspond to the structures shown in FIGS. 3, 4, 5, and 6.

In the minimal magnetic-field measurement Dewar vessel having the above-described composition which includes the inner container containing the superconducting device and cooing medium, the radiation shield fabricated by fixing a many of thin stripe members of high thermal conductivity on both surfaces of the electrical insulation substrate in a large stripe density (a gap-between neighboring stripe members is very small), which is situated outside the internal container; and the outer container surrounding and holding the radiation shield and keeping the inside of the container vacuum; wherein the radiation shield is composed by fixing a plurality of thin stripe members in which a groove is formed between neighboring stripe members, and a thin stripe member is formed directly above each groove via the substrate.

In fabricating a plate member of a radiation shield, this plate member is cut or bent so as to create a desired shape. In the longitudinal direction, the height of the radiation shield member 15 must be fabricated at a constant level. The plate must not be cut at an intermediate point, and this deteriorates the thermal conduction performance.

The terminal parts of the radiation shield 5 is situated surrounding without a gap outside the supporter 6 with a nonmagnetic bottom plate made of glass fiber strengthen material, which is tightly fixed to the copper flange 11 cooled by the refrigerator, so that the radiation shield supporter 6 does not contact the inner container 4 of very low temperature.

Figure 11:
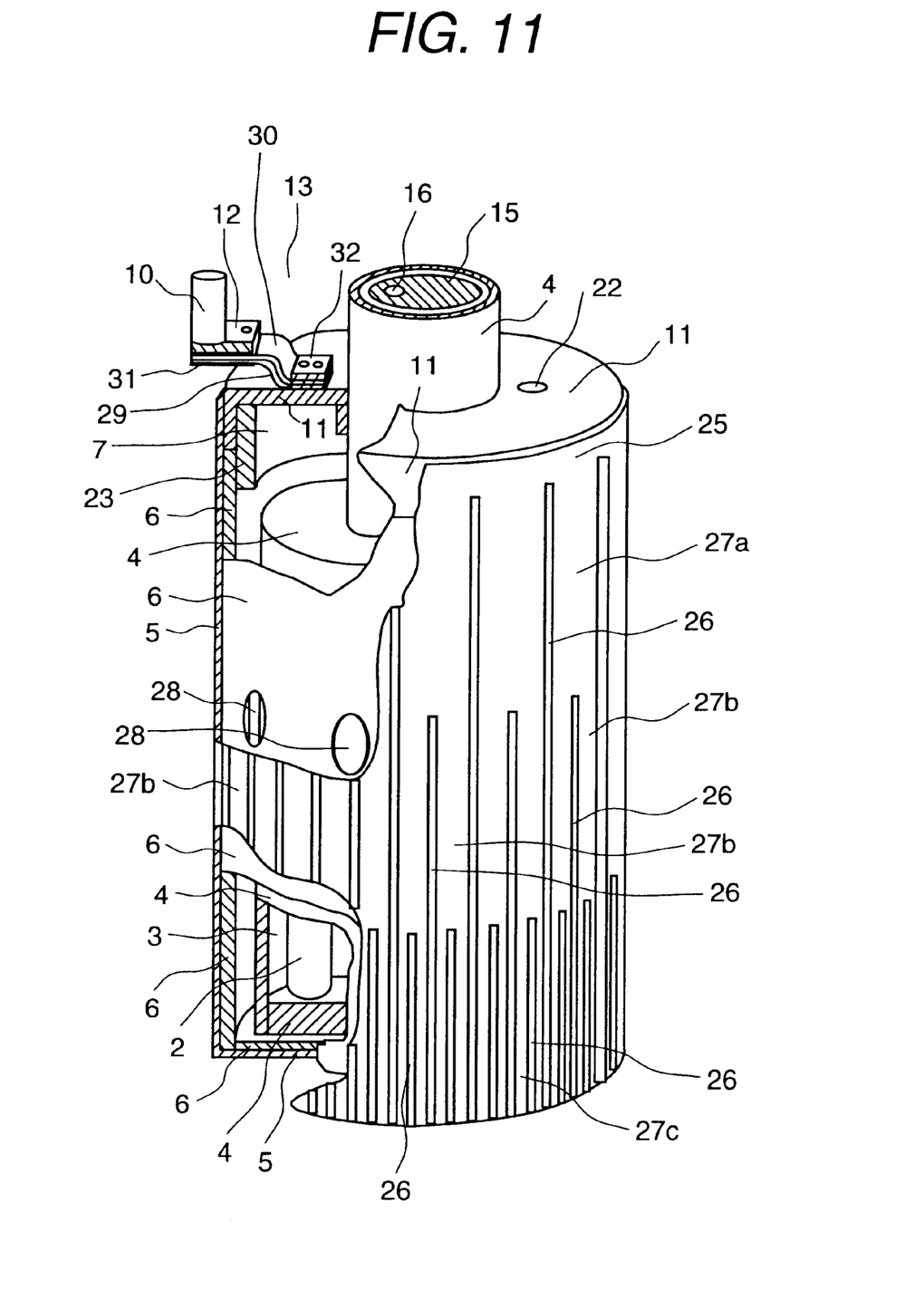
FIG. 11 is a partially cross sectional perspective view of the embodiment according to the present invention.

Also, the thermal conductor 13, which thermally connect the flange and the low temperature stage 12, is fabricated by superimposing thermal conductors 29 of a large Young's modulus, such as Indium, and a copper foil, as shown in FIG. 11. Further, this thermal conductor 13 is pressed and fixed to the low temperature stage 12 and the flange by using stainless steel pressing plates and bolts (not shown in the figure) in a well thermal contact state. By the described above composition, operation vibration of the refrigerator is prevented from propagating to the flange 11, which in turn can reduce electrical noises due to operation vibration. The thermal conductor 29 including a copper foil 30 becomes a flexible member, and this prevents the Dewar vessel from breaking in an assembling process of a Dewar vessel. Furthermore, it is possible to fabricate the thermal conductor 29 by superimposing a plurality of copper foils.

In this embodiment, toward the refrigerator and the flange 11 from the end side of the radiation shield 5, that is, the SQUID portion, the width of each stripe member increases. At every cross section of the radiation shield, a thin stripe member is formed directly above each groove via the substrate, which in turn can improve the cooling performance of the Dewar vessel, and sufficiently and uniformly cools the inside of the Dewar vessel. Furthermore, Since stripe members of high thermal conductivity are fixed to both surfaces of the electrical insulation substrate, and the width of each stripe member near the superconducting device is small, magnetic noises can be reduced. In addition, the radiation heat is greatly prevented from entering the inner container 4, and this can reduce the evaporation amount of liquid helium.

Moreover, the radiation shield supporter 6 is fixed so that the shield 6 does not contact the very low temperature inner container 4, and the radiation shield 5 can be situated outside the radiation shield supporter 6. Thus, Even if the Dewar vessel is transported, and vibrated, the inner container 4 will not contact the radiation shield, which in turn can improve the reliability of the Dewar vessel, and reduce the evaporation amount of liquid helium.

Also, the thermal conductor 13 is fabricated by superimposing a thermal conductor 29 of large Young's modulus, such as Indium and a thin copper foil, so as to have flexibility. Therefore, the operation vibration of the refrigerator is prevented from propagating to the flange 11, and this can reduce electric noises at the superconducting elements due to the refrigerator, and the break-down of the easily-deformed thermal conductor 29 can be prevented from breaking in an assembling process of the Dewar vessel. Thus, the Dewar vessel of the present invention can stably cool the flange 11 and the radiation shield 5, which in turn can reduce the evaporation amount of coolant, namely, liquid helium.

Figure 12:
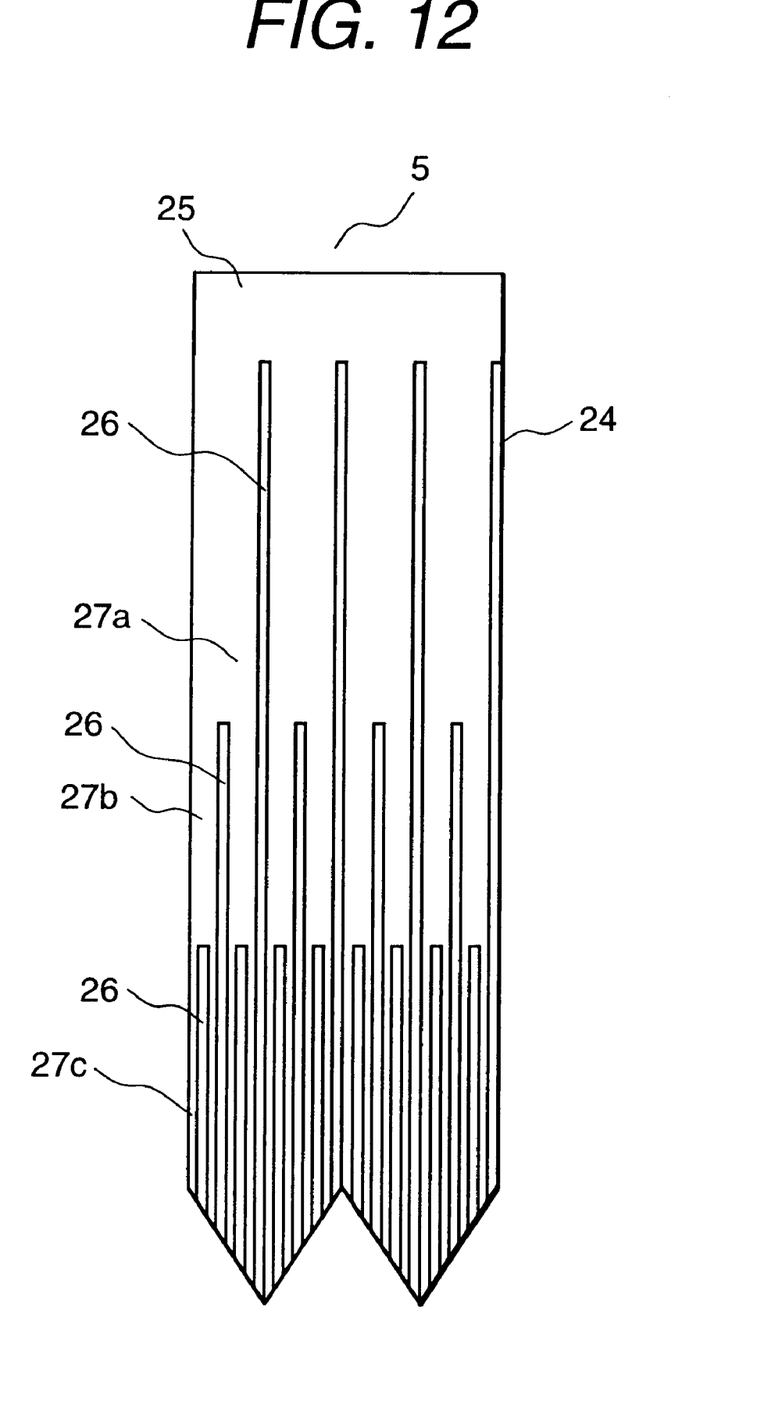
FIG. 12 is an elevation view showing the detailed composition of an radiation shield of another embodiment according to the present invention.

FIG. 12 shows an example of modification of the radiation shield 5. In this embodiment, the bottom portion consists of a plurality of tapered shapes. This composition can also bring the same advantages as that the above embodiment.

Figure 13:
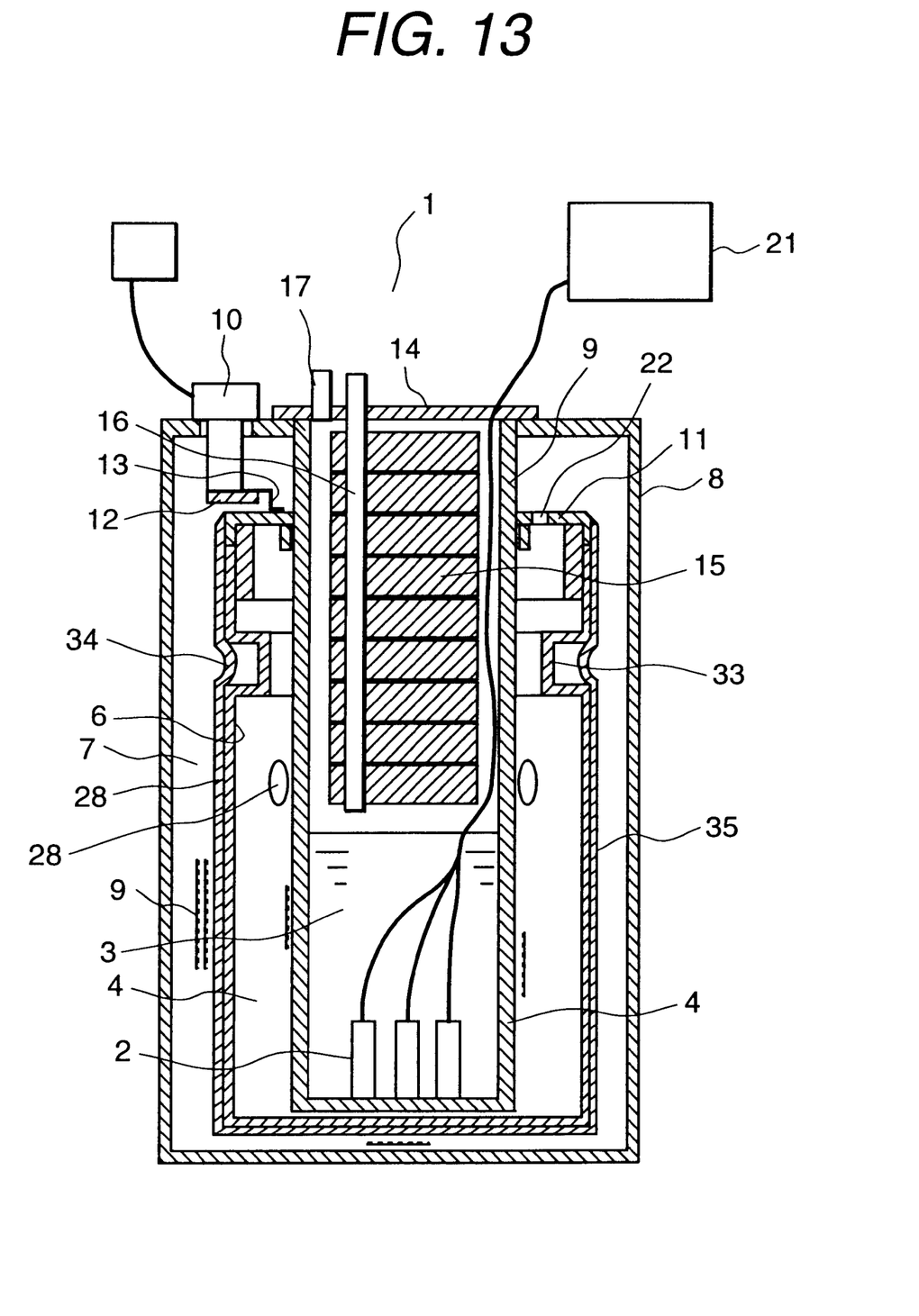
FIG. 13 is a vertical cross section showing the composition of an minimal magnetic field-measurement Dewar vessel of another embodiment according to the present invention.

FIG. 13 shows further another embodiment according to the present invention. A main different point is in that a flange 33, which is made of the same material as that making the radiation shield supporter 6, is provided on the radiation shield supporter 6. A radiation shield 35 which is a concave portion in the flange 33 (equivalent to the radiation shield 5). The other composition is the same as that of the Dewar vessel shown in FIG. 1. In the cooling operation, if the contraction amount in the direction from low to high portions is larger than that of the radiation shield supporter, the concave portion absorbs the thermal deformation, and this can prevent the radiation from breaking its deformation, which in turn increases to a high temperature, and loss the cooling ability of the Dewar vessel. According to this embodiment, since the radiation shield 35 can be stably cooled in a low temperature state, the evaporation amount of liquid helium cab be reduced.

Although the above embodiments are composed by using, line parallel members, if zigzag shaped members are used in a horizontal portion, it brings the same advantages as the above embodiment. Further, as the refrigerator, each of the following types can be used: Gifford McMahone type, Solvey type, Pelthie element type, etc.

As described above, in the Dewar vessel of the present invention, a radiation shield is composed by thin wires or thin members are integrated (or fixed) to one or both surface of an electrical insulation substrate for supporting the radiation shield, Further, the width of each cooling line member is increased in the direction from the SQUId to the refrigerator. Accordingly, the radiation shield well cool the Dewar vessel, and the evaporation amount can be reduced. In addition, in the above composition of the Dewar vessel, a minimal magnetic-field changes, which is to be measured by the SQUId, scarcely receives noises. Moreover, since, in order that the radiation shield supporter 6 contacts the very low temperature 4, the radiation shield 5 can be attached to the supporter 6, the inner container 4 hardly contacts the radiation shield 5 during transportation of the Dewar vessel, or the vibration applied from the outside, it has become possible to stably operate the Dewar vessel, and to reduce the evaporation amount of liquid helium.

What is claimed is:

1. A minimal magnetic-field measurement Dewar vessel including an inner container which contains a superconducting device and cooling medium; a radiation shield which is composed of an electrical insulation substrate and a first and second plurality of thin line stripes provided on opposite surfaces of said electrical insulation substrate so that said first plurality of thin line stripes is electrically insulated from said second plurality of thin line stripes and provided in a high stripe dense state; an outer container which surrounds said radiation shield, and in which a vacuum state is kept; and a cooling apparatus which cools said radiation shield;

wherein a width of one portion of at least one of said first and second plurality of thin line stripes arranged in one area of said radiation shield surrounding said superconducting device is smaller than a width of another portion of said at least one of said first and second plurality of thin line stripes arranged in another area of said radiation shield, respectively.

2. A minimal magnetic-field measurement Dewar vessel according to claim 1, wherein, in said radiation shield, the number thin line stripes arranged in said one area is larger than the number of thin line stripes arranged in said another area.

3. A minimal magnetic-field measurement Dewar vessel according to claim 1, wherein a groove is provided between neighboring thin line stripes of at least said one portion.

4. A minimal magnetic-field measurement Dewar vessel according to claim 1, wherein a bottom of said one portion consists of a plurality of tapered shapes.

5. A minimal magnetic-field measurement Dewar vessel according to claim 1, further including a refrigerator for cooling said radiation shield, a low temperature stage included in said refrigerator, and a flexibly deformed conductor for connecting said low temperate stage and a flange of said radiation shield.

6. A minimal magnetic-field measurement Dewar vessel according to claim 1, wherein said radiation shield and said cooling apparatus is connected by a connection member composed by superimposing a plurality of conduction layers of different Young's ratios.

7. A minimal magnetic-field measurement Dewar vessel as defined in claim 1, wherein said radiation shield is partially fixed to said inner container so as to keep a predetermined clearance with said inner container.

8. A minimal magnetic-field measurement Dewar vessel including an inner container which contains a superconducting device and cooling medium; a radiation shield which is composed of an electrical insulation substrate and a first and second plurality of thin line stripes provided on opposite surfaces of said electrical insulation substrate so that said first plurality of thin line stripes is electrically insulated from said second plurality of thin line strips and provided in a high strip dense state; an outer container which surrounds said radiation shield, and in which a vacuum state is kept; and a cooling apparatus which cools said radiation shield;

wherein a width of one portion of at least one of said first and second plurality thin line stripes arranged in one area surrounding said superconducting device is smaller than a width of another portion of said at least one of said first and second plurality of thin line stripes, said first and second plurality of thin line stripes having grooves therebetween, and at least a portion of a respective one of one of said first and second plurality of thin line stripes is always formed at an opposed position of a respective groove of said other of said first and second plurality of thin line stripes.

9. A minimal magnetic-field measurement Dewar vessel according to claim 8, wherein, in said radiation shield, the number thin line stripes arranged in said one area is larger than the number of thin line stripes arranged in said another area.

10. A minimal magnetic-field measurement Dewar vessel according to claim 9, wherein the number density is largest, and the width is smallest, of said thin line stripes in the radiation shield, at said one portion.

* * * * *